(12) United States Patent
Braceras et al.

(10) Patent No.: US 9,460,811 B2
(45) Date of Patent: Oct. 4, 2016

(54) READ ONLY MEMORY (ROM) WITH REDUNDANCY

(71) Applicant: INTERNATIONAL BUSINESS MACHINES CORPORATION, Armonk, NY (US)

(72) Inventors: George M. Braceras, Essex Junction, VT (US); Albert M. Chu, Nashua, NH (US); Kevin W. Gorman, Fairfax, VT (US); Michael R. Ouellette, Westford, VT (US); Ronald A. Piro, Essex Junction, VT (US); Daryl M. Seitzer, Beaverton, OR (US); Rohit Shetty, Essex Junction, VT (US); Thomas W. Wyckoff, Jeffersonville, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 153 days.

(21) Appl. No.: 14/453,779

(22) Filed: Aug. 7, 2014

(65) Prior Publication Data

US 2014/0351662 A1 Nov. 27, 2014

Related U.S. Application Data

(62) Division of application No. 13/445,187, filed on Apr. 12, 2012, now Pat. No. 8,839,054.

(51) Int. Cl.
| | |
|---|---|
| G11C 29/00 | (2006.01) |
| G11C 29/12 | (2006.01) |
| G11C 29/44 | (2006.01) |
| G06F 11/07 | (2006.01) |
| G11C 17/00 | (2006.01) |

(52) U.S. Cl.
CPC .......... *G11C 29/12* (2013.01); *G06F 11/0793* (2013.01); *G11C 29/4401* (2013.01); *G11C 29/822* (2013.01); *G11C 17/00* (2013.01)

(58) Field of Classification Search
CPC combination set(s) only.
See application file for complete search history.

(56) References Cited

U.S. PATENT DOCUMENTS

| | | | |
|---|---|---|---|
| 5,179,536 A | | 1/1993 | Kasa et al. |
| 5,345,582 A | * | 9/1994 | Tsuchiya ............. G06F 11/1016 714/53 |
| 5,467,457 A | | 11/1995 | Kohda et al. |
| 5,485,424 A | | 1/1996 | Kawamura |

(Continued)

OTHER PUBLICATIONS

N. N. Purushotham "Built-in Controller for Self-Test and Repair of 30 Integrated Nanci Flash Memory Chip, Used i11 Radiation Intense Space Environment", B. Tech., Electronics and Communication, Dec. 2010, 105 pages.

*Primary Examiner* — Guerrier Merant
(74) *Attorney, Agent, or Firm* — David Cain; Andrew M. Calderon; Roberts Mlotkowski Safran, Cole & Calderon, P.C.

(57) ABSTRACT

A read only memory (ROM) with redundancy and methods of use are provided. The ROM with redundancy includes a programmable array coupled to a repair circuit having one or more redundant repairs. The one or more redundant repairs include a word address match logic block, a data I/O address, and a tri-state buffer. The word address match logic block is provided to the tri-state buffer as a control input and the data I/O address is provided to the tri-state buffer as an input. An output of the tri-state buffer of each redundant repair is provided as a first input to one or more logic devices. One or more data outputs of a ROM bit cell array is provided as a second input to a respective one of the one or more logic devices.

8 Claims, 9 Drawing Sheets

(56) References Cited

U.S. PATENT DOCUMENTS

| | | | | |
|---|---|---|---|---|
| 5,577,050 | A * | 11/1996 | Bair | G11C 29/72 365/201 |
| 5,822,257 | A | 10/1998 | Ogawa | |
| 5,878,048 | A | 3/1999 | Ishiguro | |
| 5,889,711 | A | 3/1999 | Yang et al. | |
| 6,373,758 | B1 * | 4/2002 | Hughes | G11C 29/72 365/200 |
| 6,421,799 | B1 | 7/2002 | Ferrant | |
| 6,473,352 | B2 | 10/2002 | Nishino et al. | |
| 6,484,271 | B1 | 11/2002 | Gray | |
| 6,563,751 | B1 * | 5/2003 | Wu | G11C 29/14 365/201 |
| 6,795,942 | B1 * | 9/2004 | Schwarz | G11C 29/44 714/711 |
| 6,987,684 | B1 * | 1/2006 | Branth | G06F 11/1064 365/189.15 |
| 7,174,477 | B2 | 2/2007 | Derner et al. | |
| 7,218,558 | B2 | 5/2007 | Kang et al. | |
| 7,349,253 | B2 | 3/2008 | Perner et al. | |
| 7,366,946 | B2 | 4/2008 | Derner et al. | |
| 7,474,576 | B2 | 1/2009 | Co et al. | |
| 7,689,881 | B2 | 3/2010 | Shuma | |
| 7,770,067 | B2 | 8/2010 | Lockwood et al. | |
| 7,908,527 | B2 | 3/2011 | Kohara et al. | |
| 2003/0095455 | A1 | 5/2003 | Dono et al. | |
| 2004/0093540 | A1 * | 5/2004 | Adams | G11C 29/40 714/718 |
| 2004/0218431 | A1 | 11/2004 | Chung et al. | |
| 2004/0225939 | A1 * | 11/2004 | Adams | G11C 29/44 714/733 |
| 2005/0149839 | A1 * | 7/2005 | Dent | H03M 13/2915 714/800 |
| 2006/0050576 | A1 * | 3/2006 | Kim | G06F 11/1068 365/200 |
| 2007/0101194 | A1 * | 5/2007 | Lockwood | G06F 11/2236 714/30 |
| 2007/0136644 | A1 * | 6/2007 | Katagiri | H03M 13/13 714/777 |
| 2008/0263385 | A1 | 10/2008 | Dudeck et al. | |
| 2009/0248955 | A1 | 10/2009 | Tamada | |
| 2009/0319840 | A1 | 12/2009 | Hara et al. | |
| 2011/0055660 | A1 | 3/2011 | Dudeck et al. | |
| 2011/0225475 | A1 | 9/2011 | Kumar et al. | |
| 2011/0231716 | A1 * | 9/2011 | Prakash | G11C 29/12 714/718 |
| 2013/0246889 | A1 | 9/2013 | Kumar et al. | |

\* cited by examiner

READ ONLY MEMORY (ROM) WITH REDUNDANCY

FIELD OF THE INVENTION

The invention relates to semiconductor structures and, more particularly, to a read only memory (ROM) with redundancy and methods of use.

BACKGROUND

Large quantities of read-only memory (ROM) are required in deep submicron technology, i.e., 32 nm technology, System on a Chip (SoC) designs. However, as the size of technology is reduced, it becomes more difficult to manufacture chips with sufficient ROM without defects. Accordingly, the ability to repair ROM bit failures is required to produce chips with sufficient ROM. But, ROM redundancy introduces challenges not encountered with random-access memory (RAM) redundancy. More specifically, redundant elements in the ROM are loaded with specific data contents of the segment of the array being replaced. This is accomplished by replacing an entire word in the address space which requires routing the entire data width of the ROM. Replacing an entire word requires more data routing than repairing a failed bit.

To determine if a bit has failed, ROM built-in-self-test (BIST) techniques sum the data read sequentially from the address space into a multiple input signature register (MISR), and compare the resultant signature to the expected signature for array contents in a single "Go/No-Go" comparison. However, the ROM BIST does not identify the address of the failing bit. Instead, an external diagnostic tester is used to identify the failing address and the data positions which require repair, which is then coded into programmable memory elements. That is, ROM BIST reads the ROM and compresses the content into the MISR, which is compared to the expected MISR value to determine whether the bit value is incorrect. However, the ROM BIST does not determine the location of a failed bit without the assistance of a diagnostic tester.

Accordingly, there exists a need in the art to overcome the deficiencies and limitations described hereinabove.

SUMMARY

In an aspect of the invention, a read-only memory (ROM) with redundancy comprises a programmable array coupled to a repair circuit having one or more redundant repairs. The one or more redundant repairs comprise a word address match logic block, a data I/O address, and a tri-state buffer. The word address match logic block is provided to the tri-state buffer as a control input and the data I/O address is provided to the tri-state buffer as an input. An output of the tri-state buffer of each redundant repair is provided as a first input to one or more logic devices. One or more data outputs of a ROM bit cell array is provided as a second input to a respective one of the one or more logic devices.

In an aspect of the invention, a method comprises performing a read-only memory (ROM) built-in-self-test (BIST) to determine a bit failure. The method also comprises identifying a row having the bit failure and comparing columns of the row having the bit failure with expected results to determine the location of the bit failure. The method further comprises performing a soft repair to repair the bit failure in a ROM.

In an aspect of the invention, a method comprises performing a read-only memory (ROM) built-in-self-test of an error correction code (ECC) word to determine a bit failure. The method also comprises conducting an ECC-based diagnostic to determine whether there are multiple bit failures and identifying an address of the bit failure. The method further comprises performing a soft repair to repair the bit failure, and performing a hard repair to store a corrected data value in a hardware component.

In another aspect of the invention, a structure comprises a read-only memory (ROM) bit cell array and an error correction code (ECC) serialized word embedded in the ROM bit cell array. The structure further comprises a repair circuit coupled to a programmable array and one or more outputs of the ROM bit cell array. The structure also comprises a ROM built-in-self-test (RBIST) multiple input signature register (MISR) and a hamming code logic circuit coupled to an output of the repair circuit. The ROM bit cell array is expanded to include ECC bits in the serialized word. The hamming code logic circuit identifies a location of a bit failure and the repair circuit comprises one or more redundant repairs having a word address match logic block, a data I/O address, and a tri-state buffer. The word address match logic block is provided to the tri-state buffer as a control input and the data I/O address is provided to the tri-state buffer as an input. An output of the tri-state buffer of each redundant repair is provided as a first input to one or more logic devices. One or more data outputs of a ROM bit cell array is provided as a second input to a respective one of the one or more logic devices.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of a read only memory with redundancy, which comprises the structures of the present invention. In still further embodiments, a method in a computer-aided design system is provided for generating a functional design model of the read only memory with redundancy. The method comprises generating a functional representation of the structural elements of the read only memory with redundancy.

BRIEF DESCRIPTION OF THE SEVERAL VIEWS OF THE DRAWINGS

The present invention is further described in the detailed description which follows, in reference to the noted plurality of drawings by way of non-limiting examples of exemplary embodiments of the present invention, in which like reference numerals represent similar parts throughout the several views of the drawings, and wherein.

DETAILED DESCRIPTION

The invention relates to semiconductor structures and, more particularly, to a read only memory (ROM) with redundancy and methods of use. In embodiments, the ROM with redundancy includes a programmable array coupled to one or more redundant repairs. The one or more redundant repairs include a word address match logic block, data value, and data I/O address. The data I/O address is provided as an input to a first tri-state buffer, the data value is provided as an input to a second tri-state buffer, and the word address match logic block is provided as a control input to the first and second tri-state buffers. An output of each of the first tri-state buffers is provided as a select signal to a respective 2-to-1 multiplexer, and an output of the second tri-state buffer is provided as a first input to each of the respective multiplexers. In addition, one or more data outputs of a ROM bit cell array are provided to a respective multiplexer.

According to aspects of the invention, the present invention advantageously provides for single bit repair in a word of a read-only memory (ROM). In this way, the present invention provides for reduced impact on access time and data I/O area. Additionally, the present invention provides for reduced set up time. The present invention also advantageously provides for multiple bit repair for multiple rows. More specifically, the present invention provides for repairing weak bits which are unable to pull-down to a bitline in an allotted sense time, resulting in "stuck-at-1" fails. Further, according to aspects of the invention, the present invention provides for repairing multiple bits having either polarity (i.e., 1 or 0). That is, the present invention provides for driving "stuck-at-1" fails to a low logic and "stuck-at-0" fails to a high logic. In this way, the present invention reduces process variations, increases bit cell array performance, and increases repair flexibility.

Further, the present invention provides for determining the location of a failed bit without the use of an external diagnostic tester. In this way, the present invention reduces the test time for locating a failed bit. For example, the present invention implements error correction code (ECC) by serializing multiple words into a single, longer word and utilizes hamming code bits to determine the location of a failed bit. Accordingly, the present invention provides for increased die area for additional components on a semiconductor chip. In addition, the present invention may be used in other memory devices, such as, for example, static random-access memory (SRAM).

Figure 1:
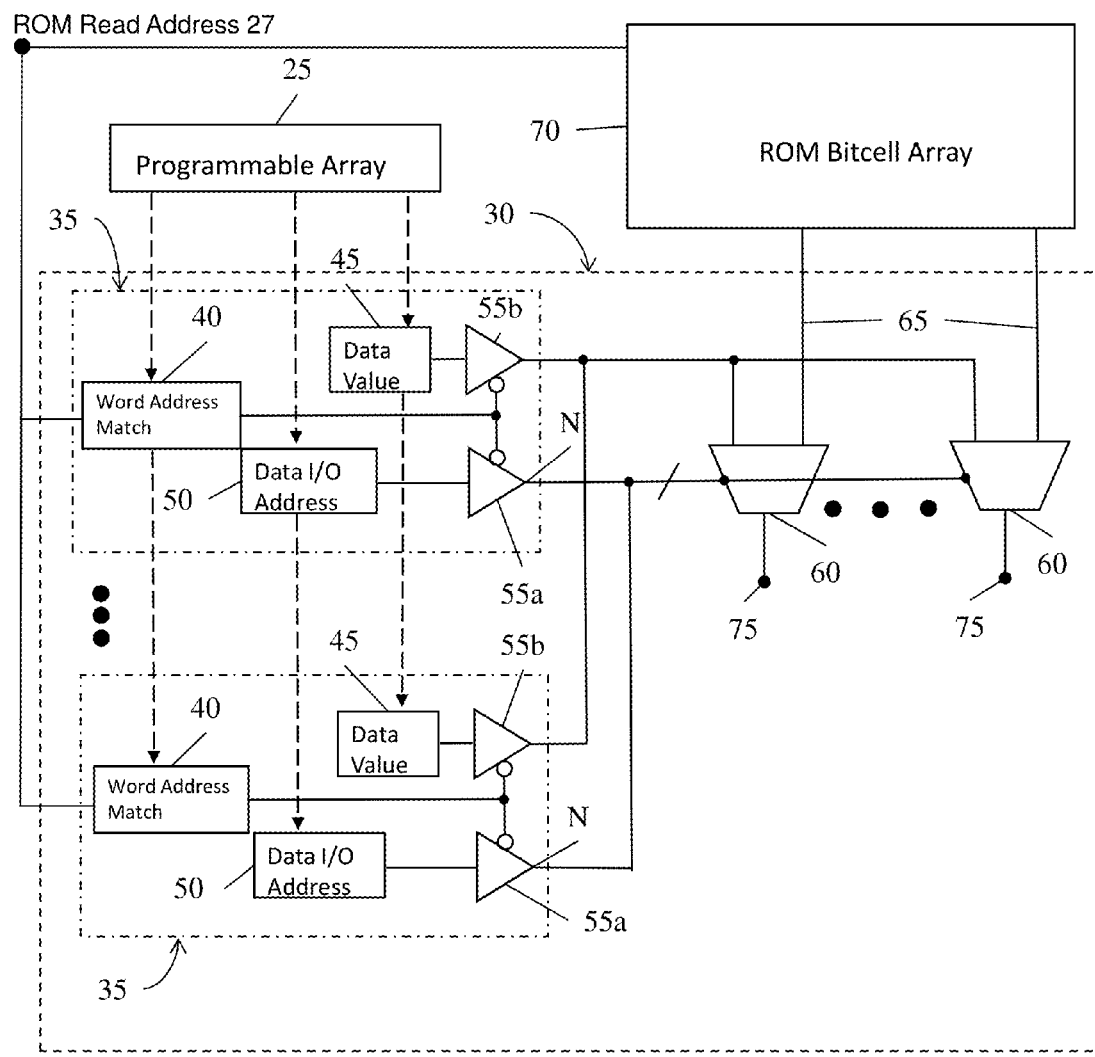
FIG. 1 shows a repair circuit for single bit repair in accordance with aspects of the present invention.

FIG. 1 shows a circuit for single bit repair in accordance with aspects of the present invention. More specifically, in embodiments, a programmable array 25 is coupled to a repair circuit 30 having one or more redundant repairs 35. In embodiments, the one or more redundant repairs 35 include a word address match logic block 40, a data value 45, and a data I/O address 50. In embodiments, the word address match logic block 40 compares a ROM read address 27 with a repair location word address stored in the programmable array 25, and outputs an enable logic when the ROM read address 27 and the repair location word address are equal. In embodiments, the data value 45 is a correct data value of the failed bit, and the data I/O address 50 indicates which particular bit has failed. Although FIG. 1 shows the repair circuit 30 having two redundant repairs 35, it should be understood by those of ordinary skill in the art that any number of redundant repairs 35 may be implemented in accordance with aspects of the present invention.

In embodiments, the one or more redundant repairs 35 further include a first tri-state buffer 55a and a second tri-state buffer 55b. In operation, the data I/O address 50 is provided as an input to the first tri-state buffer 55a and the data value 45 is provided as an input to the second tri-state buffer 55b. Also, the word address match logic block 40 is provided as a control input to the tri-state buffers 55a, 55b. In embodiments, the tri-state buffers 55a, 55b function as inverters and have an active low control. Additionally, the outputs of the tri-state buffers 55a, 55b are driven to a low logic, a high logic or a high impedance state. In embodiments, the second tri-state buffers 55b are defaulted to an unselected state when the tri-state buffers 55a, 55b are in the high impedance state.

In embodiments, an output N of each of the first tri-state buffers 55a is provided as a unique select signal to a respective 2-to-1 multiplexer 60. In embodiments, an output of the second tri-state buffer 55b is a one bit wide bus, and is provided as a first input to each of the multiplexers 60. In addition, one or more data outputs 65 of a ROM bit cell array 70 are provided to a respective multiplexer 60. Although FIG. 1 shows the ROM bit cell array 70 having two data outputs 65, it should be understood by those of ordinary skill in the art that any number of data outputs 65 may be implemented in accordance with aspects of the present invention. In embodiments, the respective multiplexer 60 coupled to a first data output of the one or more data outputs 65 represents the least significant bit and the respective multiplexer 60 coupled to a last data output of the one or more data outputs 65 represents the most significant bit.

In embodiments, when N=0, e.g., when the first tri-state buffer 55a is in an unselected state, an output 75 of one of the multiplexers 60 is the value of the data output 65 of the ROM bit cell array 70. Alternatively, when N=1, e.g., when the first tri-state buffer 55a is in an selected state, the output 75 of one of the multiplexers 60 is the value of the output of the second tri-state buffer 55b. In this way, the multiplexers 60 output the data value of the ROM bit cell array 70 when the bit is correct, and output the value of the redundant repair 35 when a failed bit is detected. Accordingly, the repair circuit 30 corrects a single failed bit for multiple rows.

Figure 2:
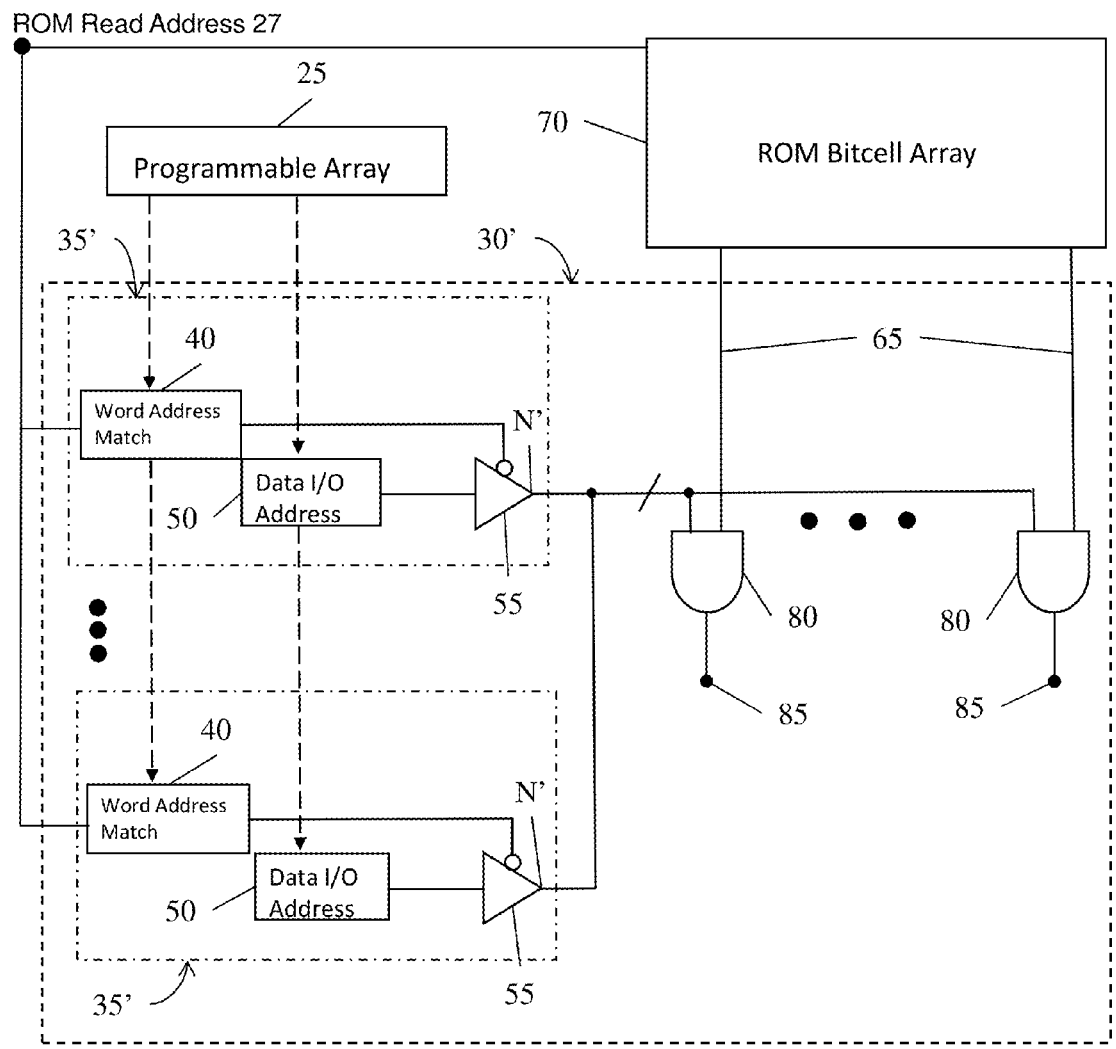
FIG. 2 shows a repair circuit for multiple bit repairs in accordance with aspects of the present invention.

FIG. 2 shows a repair circuit 30' for multiple bit repairs for multiple rows in accordance with aspects of the present invention. More specifically, in comparison to FIG. 1, redundant repair 35' includes the word address match logic block 40, the data I/O address 50, and a tri-state buffer 55. In addition, an output N' of the tri-state buffers 55 and the one or more data outputs 65 of the ROM bit cell array 70 are provided as a first input and a second input, respectively, to a respective two-way AND gate 80. The remaining structure of FIG. 2 is the same as the structure shown in FIG. 1. More specifically, the programmable array 25 is coupled to repair circuit 30', the word address match logic block 40 is provided to the tri-state buffer 55 as a control input and the data I/O address 50 is provided to the tri-state buffer 55 as an input.

In embodiments, the repair circuit 30' functions to drive an output 85 of the AND gates 80 to a low logic. More specifically, when N'=0, the output 85 of the AND gates 80 is driven to a low logic. That is, when N'=0, the output 85 of the AND gates 80 is a low logic regardless of the value of the data output 65 of the ROM bit cell array 70. When N'=1, the output 85 of the AND gates 80 is the value of the data output 65 of the ROM bit cell array 70. In this way, the repair circuit 30' implements logical conjunction, e.g., a high output results only if both inputs to the AND gate are high, to drive "stuck-at-1" bits to 0. As such, in embodiments, the present invention advantageously improves array performance.

Figure 3:
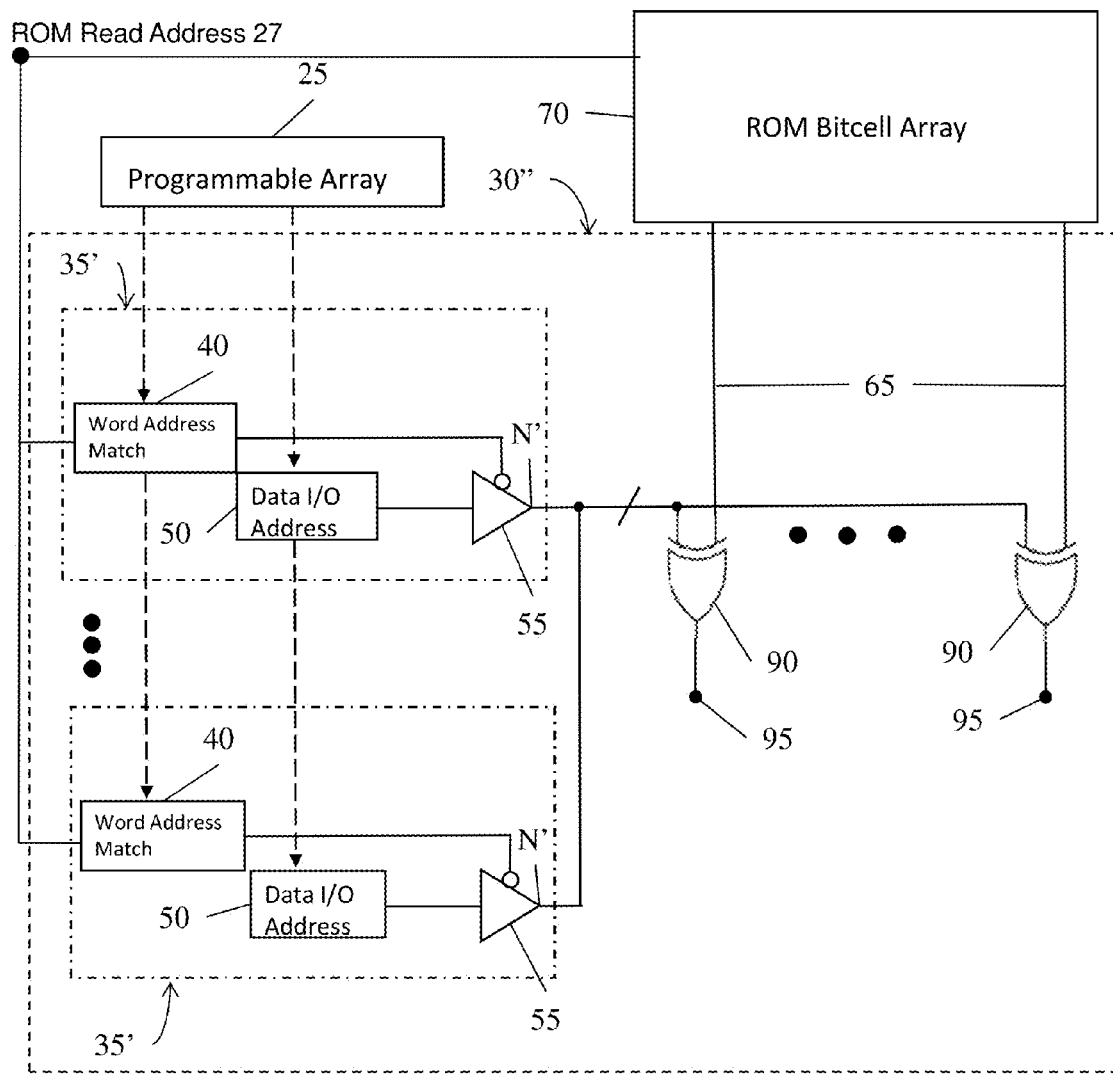
FIG. 3 shows an alternate repair circuit for multiple bit repairs in accordance with aspects of the present invention.

FIG. 3 shows a repair circuit 30" for multiple bit repairs in accordance with aspects of the present invention. More specifically, in comparison with FIG. 2, an output N' of the tri-state buffer 55 and the one or more data outputs 65 of the ROM bit cell array 70 are provided as a first input and a second input, respectively, to a respective exclusive-or (XOR) gate 90. The remaining structure of FIG. 3 is the same as the structure shown in FIG. 2. More specifically, the programmable array 25 is coupled to repair circuit 30", the word address match logic block 40 is provided to the tri-state buffer 55 as a control input and the data I/O address 50 is provided to the tri-state buffer 55 as an input.

In embodiments, the repair circuit 30" repairs multiple bits, with either polarity of data, in a word. More specifically, the repair circuit 30" implements XOR logic to invert the failed bit to the correct value. In embodiments, the output N' is driven high when the row and data bit position are both activated for a repair. That is, when N'=1, the XOR gate 90 inverts the data output 65 of the ROM bit cell array 70. In this way, in embodiments, the repair circuit 30" functions to drive "stuck-at-1" bits to a low logic or to drive "stuck-at-0" bits to a high logic. As such, in embodiments, the present invention offers increased flexibility to repair multiple bits in multiple rows.

Figure 4:
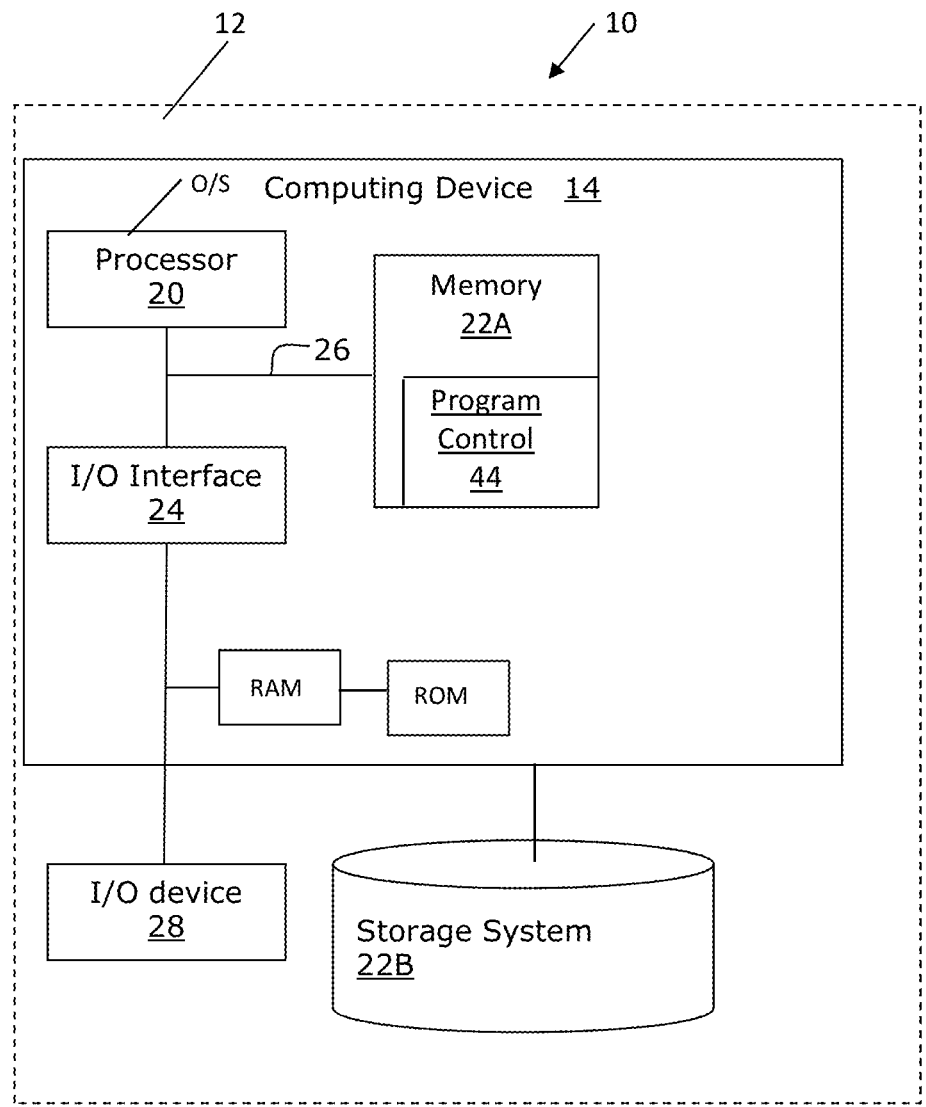
FIG. 4 shows a computer infrastructure in accordance with aspects of the present invention.

Referring to FIG. 4, as will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device. Program code embodied on a computer readable medium may be transmitted using any appropriate medium, including but not limited to wireless, wireline, optical fiber cable, RF, etc., or any suitable combination of the foregoing.

More specifically, FIG. 4 shows an illustrative environment 10 for managing the processes in accordance with the invention. To this extent, the environment 10 includes a server or other computing system 12 that can perform the processes described herein. In particular, the server 12 includes a computing device 14. The computing device 14 can be resident on a network infrastructure or computing device of a third party service provider.

The computing device 14 also includes a processor 20, memory 22A, an I/O interface 24, and a bus 26. The memory 22A can include local memory employed during actual execution of program code, bulk storage, and cache memories which provide temporary storage of at least some program code in order to reduce the number of times code must be retrieved from bulk storage during execution. In addition, the computing device includes random access memory (RAM), a read-only memory (ROM), and an operating system (O/S).

The computing device 14 is in communication with the external I/O device/resource 28 and the storage system 22B. For example, the I/O device 28 can comprise any device that enables an individual to interact with the computing device 14 (e.g., user interface) or any device that enables the computing device 14 to communicate with one or more other computing devices using any type of communications link. The external I/O device/resource 28 may be for example, a handheld device, PDA, handset, keyboard etc.

The processor 20 executes computer program code (e.g., program control 44), which can be stored in the memory 22A and/or storage system 22B. While executing the computer program code, the processor 20 can read and/or write data to/from memory 22A, storage system 22B, and/or I/O interface 24. While executing the computer program code, the processor 20 can read and/or write data to/from memory 22A, storage system 22B, and/or I/O interface 24. The program code executes the processes of the invention such as, identifying a row having a bit failure and performing a soft repair.

Figure 5:
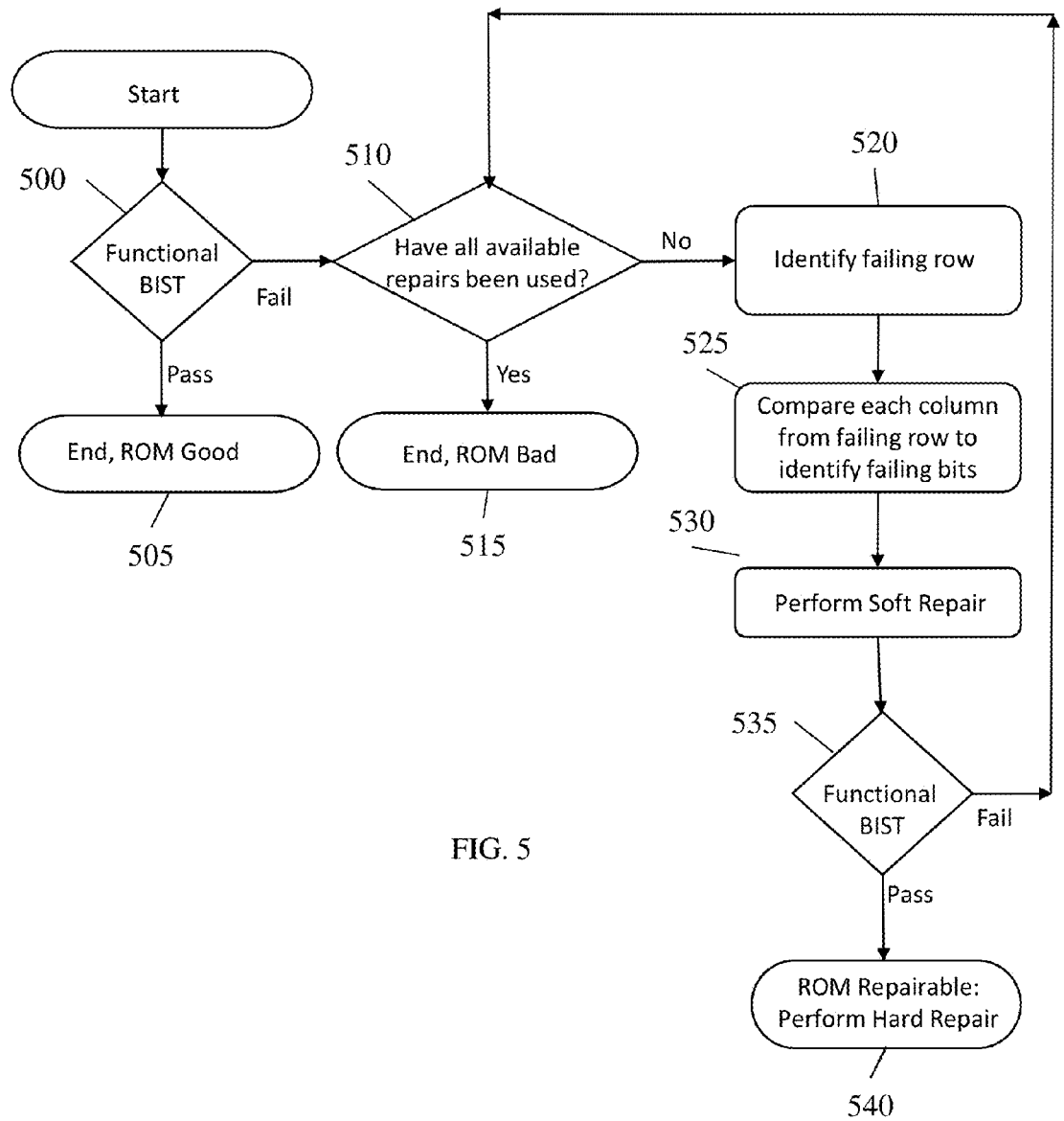
FIG. 5 shows a flow chart for repairing a bit in accordance with aspects of the present invention.
Figure 8:
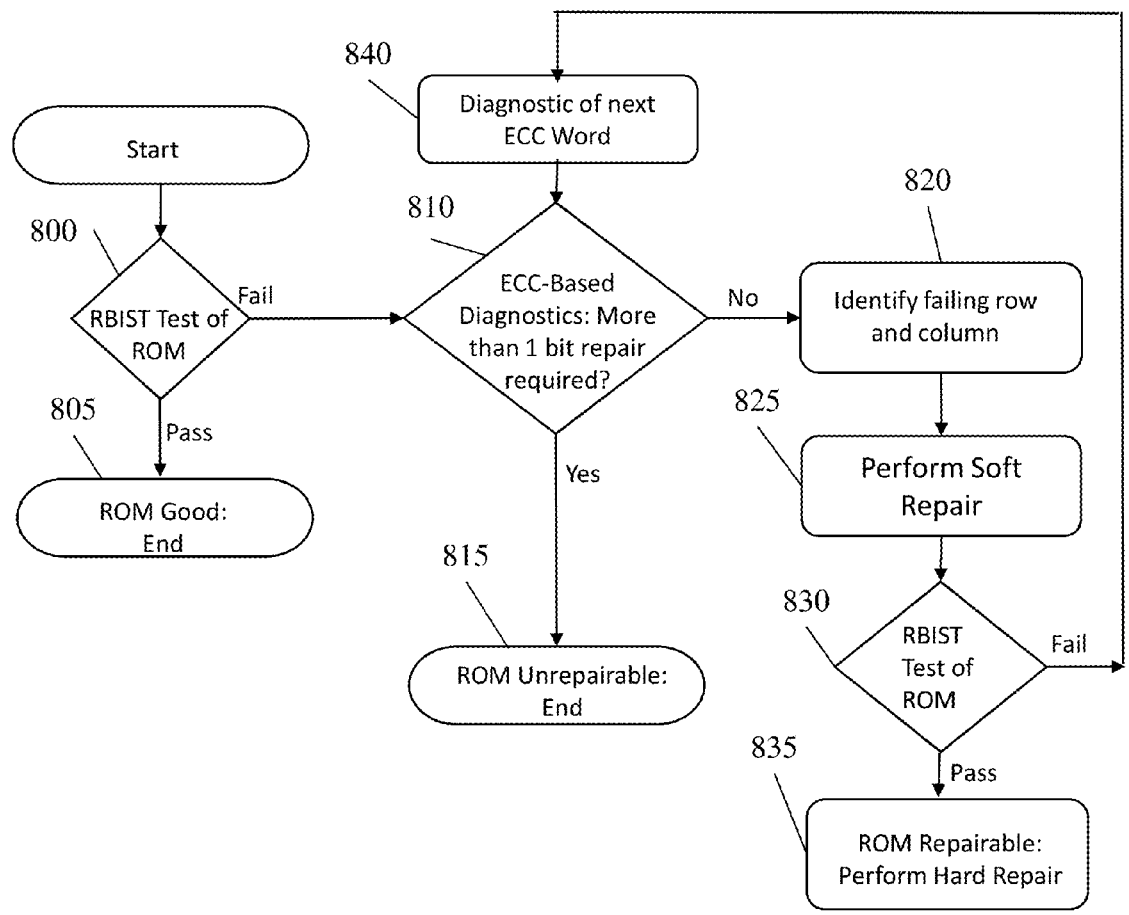
FIG. 8 shows a flow chart for error correction code (ECC) based ROM repair in accordance with aspects of the present invention.

FIGS. 5 and 8 show exemplary process flows for performing aspects of the present invention. The steps of FIGS. 5 and 8 may be implemented in the environment of FIG. 4. The flowcharts in FIGS. 5 and 8 illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Furthermore, the invention can take the form of a computer program product accessible from a computer-usable or computer-readable medium providing program code for use by or in connection with a computer or any instruction execution system. The software and/or computer program product can be implemented in the environments of FIG. 4. For the purposes of this description, a computer-usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable storage medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disc-read/write (CD-R/W) and DVD.

FIG. 5 shows a flow chart for a built-in-self-test (BIST) repair test method in accordance with aspects of the present invention. More specifically, at step 500, a functional ROM BIST is performed to determine if any of the bits have failed. If none of the bits have failed, the ROM is good and does not need repair, and the process stops at step 505. If a bit has failed, at step 510, it is determined whether all available repair logics have been used. If all of the repair logics have been utilized, the ROM is bad and cannot be repaired, and the process ends at step 515. If not, at step 520, a row of the failed bit is identified, as described in more detail below. At step 525, each column of the failing row is compared to the expected results to determine the location of the failing bit. In embodiments, the expected results can be saved in a storage system, e.g., the storage system 22B of FIG. 4. After determining the location of the failing bit, at step 530, a soft repair is performed. A soft repair includes storing the repaired bit value in a memory, e.g., a non-permanent repair, as should be understood by one of ordinary skill in the art. After the soft repair is performed, a functional BIST is performed, at step 535, to determine if the soft repair corrected the bit failure. If the soft repair corrected the failed bit, at step 540, a hard repair is performed, e.g., the correct data value is stored in a programmable array, e-fuse, etc., as should be understood by those of ordinary skill in the art.

In embodiments, the failed row is identified by predetermining an expected multiple input signature register (MISR) value for a first half of rows of a bit cell array, e.g., the ROM bit cell array 70 of FIG. 1. The first half of the rows is read and compared with the expected MISR value. If the reading of the first half of the rows does not equal the expected MISR value, the failing row is located in this half of the rows. If the reading of the first half of the rows equals the expected MISR value, the failing row is located in the second half of the rows. This process is repeated until the failing row is identified, i.e., the second half of the rows is split in half and compared to the expected MISR value. Once the failed row is determined, a content of each of column address in the row is read into a tester and compared with expected results to determine the failed data bit.

Figure 6:
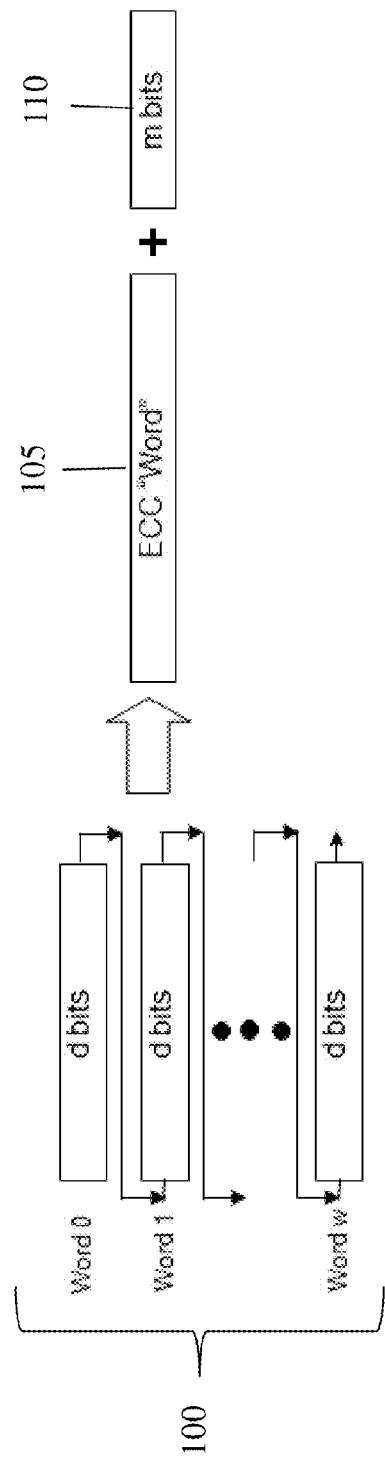
FIG. 6 shows a block diagram of serialized words in accordance with aspects of the present invention.

FIG. 6 shows a block diagram of serialized words in accordance with aspects of the present invention. More specifically, FIG. 6 shows a plurality of words 100 serialized to form an error correction code (ECC) word 105. Contents of words in a ROM are fixed, and as such, to reduce ECC area overhead, a ROM bit cell array, e.g. the ROM bit cell array 70 of FIG. 1, serializes the plurality of words 100 into a longer, serialized word, i.e., ECC word 105. In embodiments, ECC is implemented to locate bad bits in a ROM bit cell array for repair. More specifically, hamming code logic as is known to those of ordinary skill in the art is utilized to determine the location of a bit failure. As should be understood by those of ordinary skill in the art, in implementation, hamming code logic requires "m" number of ECC bits 110 per word. Accordingly, as shown in FIG. 6, "m" number of hamming bits 110 (also referred to as ECC bits) are added to the serialized, ECC word 105. In embodiments, "m" is given by a data width$<=(2^{(m-1)}-m)$ bits. For example, as shown in Table 1, a word having 16,348 bits only requires 16 ECC bits to locate a bad bit, and as such, the ECC area overhead is about 0.1%. Conventionally, ECC bits are added per word, e.g., 8 ECC bits are added to a 64 bit word, and as such, a typical ECC area overhead is about 10%.

TABLE 1

| data_bit_width | ECC Bit |
|---|---|
| 11 | 5 |
| 26 | 6 |
| 57 | 7 |
| 120 | 8 |
| 247 | 9 |
| 502 | 10 |
| 1,013 | 11 |
| 2,036 | 12 |
| 4,083 | 13 |
| 8,178 | 14 |
| 16,369 | 15 |
| 32,752 | 16 |
| 65,519 | 17 |
| 131,054 | 18 |
| 262,125 | 19 |
| 524,268 | 20 |
| 1,048,555 | 21 |

Figure 7:
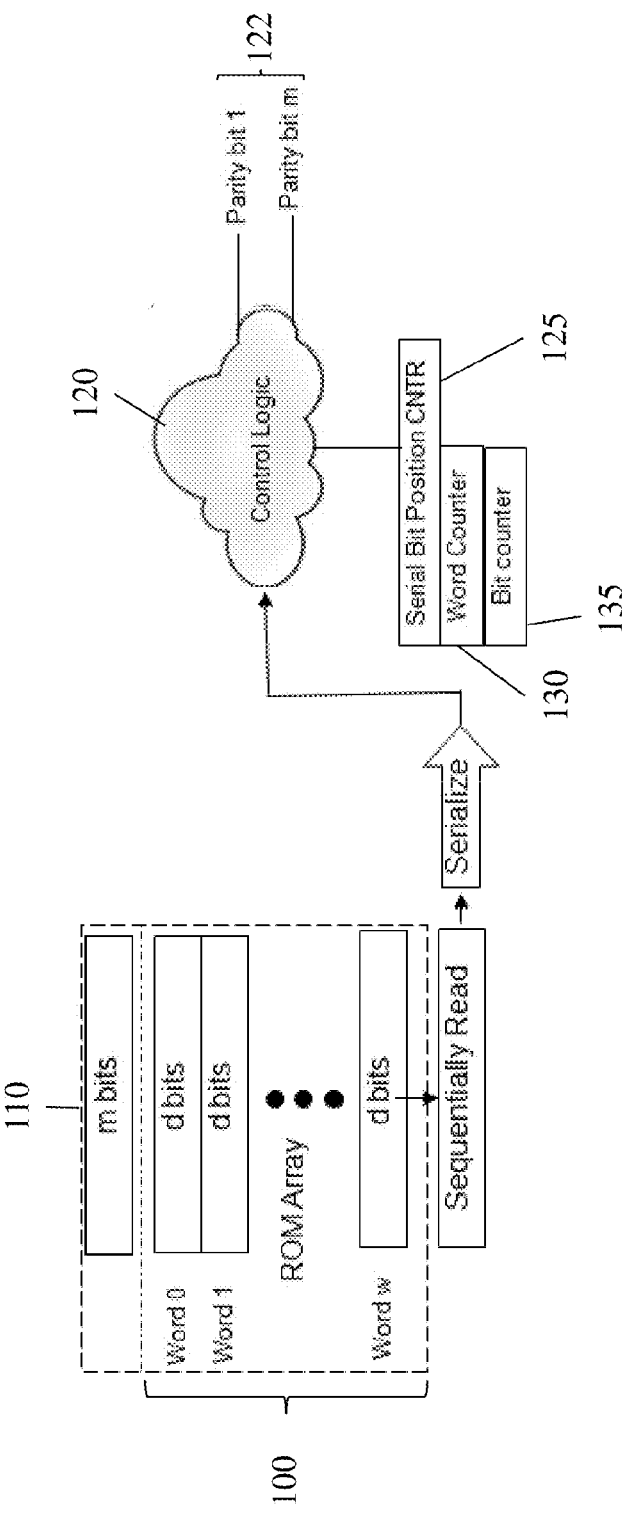
FIG. 7 shows a high level diagram of a circuit used to determine a location of failed bits in accordance with aspects of the present invention.

FIG. 7 shows a high level diagram of a circuit used to determine a location of failed bits in accordance with aspects of the present invention. More specifically, FIG. 7 shows the plurality of words 100 with the "m" number of hamming bits 110. In embodiments, the plurality of words 100 are serialized as described with respect to FIG. 6. The serialized, ECC word 110 is provided to a control logic 120. In embodiments, the control logic 120 includes logic device components, e.g. XOR gates, flip flops, etc. In embodiments, the control logic 120 reads the hamming bits 110, first. Then, as the control logic 120 reads the ECC word 105 from the ROM bit cell array, e.g. the ROM bit cell array 70 of FIG. 1, the control logic 120 inserts the hamming bits 110 into the ECC word 105 according to the hamming code logic as should be understood by one of ordinary skill in the art.

In embodiments, the control logic 120 computes a parity for each hamming bit 110 according to the hamming code logic as should be understood by those of ordinary skill in the art. In embodiments, the logic circuit 120 outputs one or more parity bits 122, and a value of the one or more parity bits 122 is compared to an expected value of the one or more parity bits 122. When the value of the one or more parity bits 122 does not match the expected value, a resulting parity word forms an address of the failed bit position. In this way, the hamming code logic uses the parity bits 122 to form a parity word to determine the location of a bit failure. In embodiments, the failed bit location is translated back to the word address and bit location using multiply, divide, add, and subtract using arithmetic logic units (ALU).

In embodiments, the logic circuit required for the ALU functions is reduced by re-running the serialized word 105 through the control logic 120 which stops when a value of a bit counter 135 is greater than the error bit position stored in a serial bit position counter 125 which stores the location of the failed bit. A word count register 130 tracks a word count which is used to determine which word of the plurality of words 100 has the failed bit. In embodiments, the control logic 120 is designed using adders to determine the error bit location as should be understood by one of ordinary skill in the art.

FIG. 8 is a flow diagram for ECC-based ROM repair in accordance with aspects of the present invention. More specifically, at step 800, a ROM BIST (RBIST) is performed to determine if any bits have failed. If all of the bits are correct, the ROM is performing properly, and the process ends at step 805. If the ROM failed the RBIST, at step 810, an ECC-based diagnostic is performed to determine whether there are multiple bit failures. If there are multiple bit failures, the ROM is bad, and the process ends at step 815. If only a single bit failure is detected, at step 820, the failing row and column are identified as discussed with respect to FIG. 7. At step 825, a soft repair is performed, as described herein. After the soft repair is performed, a RBIST is performed, at step 830, to determine if the soft repair corrected the bit failure. If the soft repair corrected the failed bit, at step 835, a hard repair is performed, e.g., the correct data value is stored in a programmable array, e-fuse, etc., as should be understood by those of ordinary skill in the art. If the soft repair did not correct all the failed bits, a diagnostic of a next ECC word is performed at step 840, and steps 810-835 are performed on the next ECC word.

Figure 9:
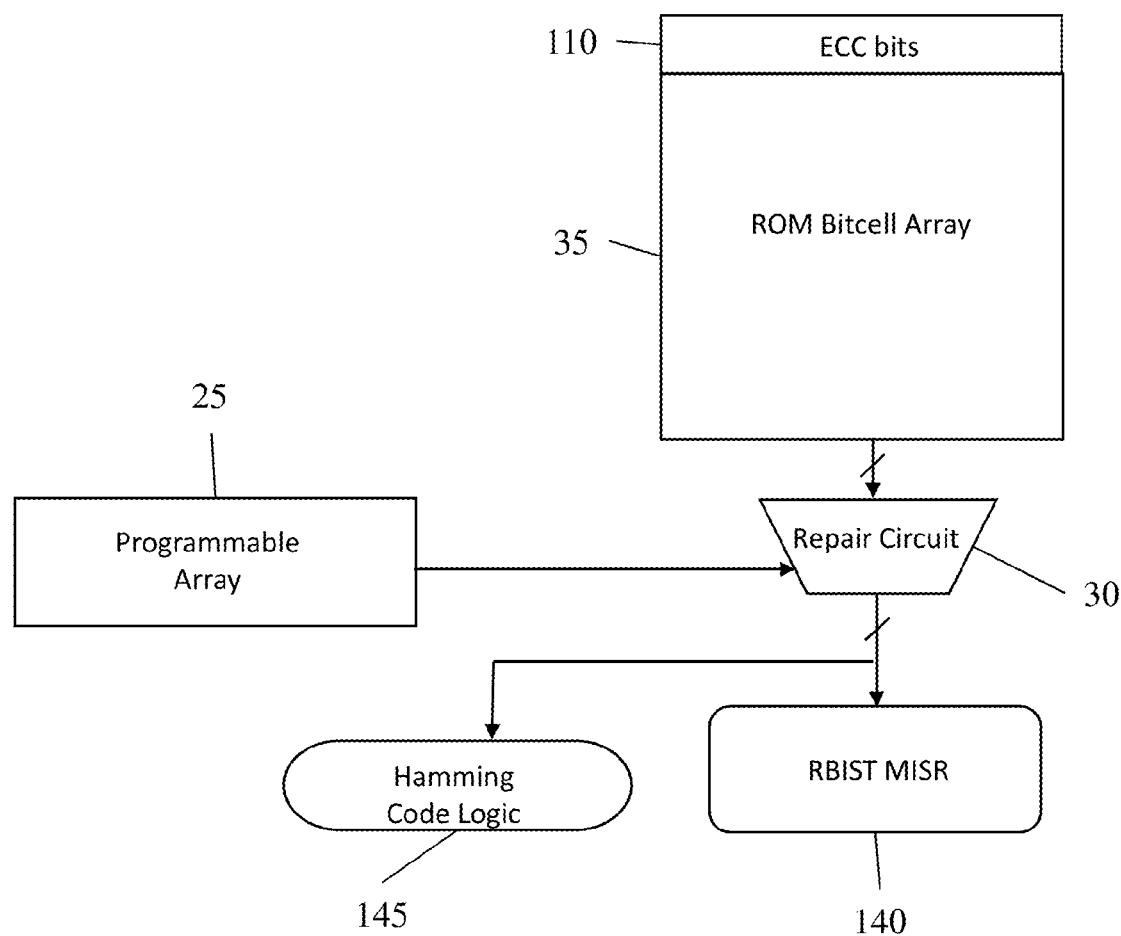
FIG. 9 shows a high level schematic of a structure for ECC based ROM repair in accordance with aspects of the present invention.

FIG. 9 shows a high level schematic of a structure for ECC based ROM repair in accordance with aspects of the present invention. More specifically, FIG. 9 shows a ROM bit cell array 70 expanded to include the ECC bits 110. In embodiments, the programmable array 25 and the ROM bit cell array 70 are coupled to a repair circuit, e.g., the repair circuit 30 of FIG. 1. It should also be understood that the schematic shown in FIG. 9 can be implemented using the repair circuit 30' of FIG. 2 and the repair circuit 30" of FIG. 3.

In embodiments, the repair circuit 30 is further coupled to a RBIST MISR 140 and hamming code logic 145. In this way, the location of a bit failure can be identified, the bit can be repaired, and tested to determine if the bit failure has been corrected. More specifically, the location of a bit failure can be identified using the hamming code logic, as described herein. In embodiments, the bit failure can be repaired by utilizing one or more multiplexers, e.g., the multiplexers 75 of FIG. 1, which output a corrected data value of the ROM bit cell array 70. Additionally, in embodiments, the bit failure can be repaired by driving "stuck-at-1" fails to a low logic or by driving "stuck-at-0" fails to a high logic, as described herein. Further, in embodiments, the repaired bit is compared with an expected value to determine whether the bit repair corrected the bit failure.

Figure 10:
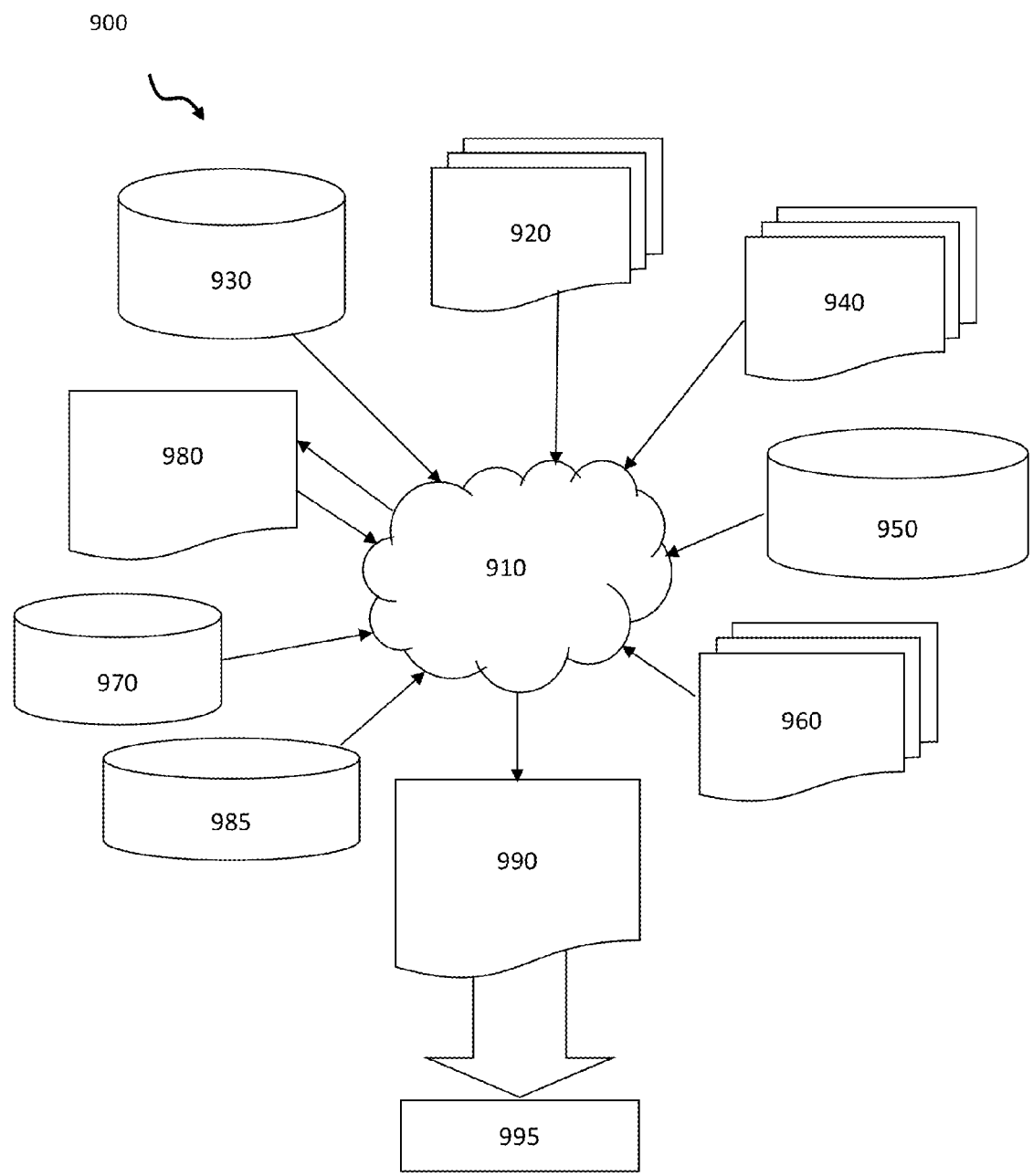
FIG. 10 is a flow diagram of a design process used in semiconductor design, manufacture, and/or test.

FIG. 10 is a flow diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-3 and 9. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 10 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-3 and 9. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-3 and 9 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-3 and 9. In one embodiment, design structure 990 may comprise a compiled, executable HDL simulation model that functionally simulates the devices shown in FIGS. 1-3 and 9.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-3 and 9. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:
1. A method, comprising:
performing a read-only memory (ROM) built-in-self-test (BIST) to determine a bit failure;
identifying a row having the bit failure;
comparing columns of the row having the bit failure with expected results to determine the location of the bit failure;
performing a soft repair to repair the bit failure in a ROM;
determining whether the soft repair corrected the bit failure using a functional BIST; and
performing a hard repair to store a corrected data value in a hardware component when the soft repair corrected the bit failure,
wherein the identifying the row having the bit failure comprises:
predetermining an expected multiple input signature register (MISR) value for a first half of rows of a ROM bit cell array;
comparing the first half of the rows with the expected MISR value;
determining whether the bit failure is in the first half of the rows or a second half of the rows;
splitting the determined half of the rows having the bit failure into a first half and a second half; and iteratively comparing the determined half of the rows to the expected MISR value and determining whether the bit failure is in the first half or the second half of the determined half of the rows.

2. The method of claim 1, further comprising:
reading a content of columns in the failing row into a tester; and
comparing the contents to expected content of the columns of the row having the bit failure to determine an address of the bit failure.

3. The method of claim 1, wherein a failed bit is an incorrect value, a stuck-at-0 bit, or a stuck-at-1 bit.

4. A method, comprising:
performing a read-only memory (ROM) built-in-self-test of an error correction code (ECC) word to determine a bit failure;
conducting an ECC-based diagnostic to determine whether there are multiple bit failures;
identifying an address of the bit failure;
performing a soft repair to repair the bit failure;
performing a hard repair to store a corrected data value of the bit failure in a hardware component;
serializing a plurality of words to form the ECC word by inserting "m" number of ECC bits according to a hamming code logic;
storing the address of the bit failure in a serial bit position counter;
re-running the serialized ECC word through the control logic; and
terminating the control logic when a value of a bit counter is greater than the address of the bit failure,
wherein the "m" number of ECC bits is given by a data width<=(2^(m−1)−m),
wherein the identifying the address of the bit failure comprises:
providing the ECC word to a control logic, wherein the control logic:
inserts the ECC bits into the ECC word;
computes a parity for the ECC bits;
outputs parity bits; and
comparing the parity bits with an expected output value, wherein parity bits with a different value than the expected output value form a parity word which indicates the address of the bit failure.

5. The method of claim 4, wherein:
the expected output value is all zeros; and
when the parity bits match the expected output value, a bit repair is unnecessary.

6. The method of claim 4, further comprising translating a location of the bit failure of the ECC word to a repair location word address, a repair location column address, and a bit data value.

7. A structure, comprising:
a read-only memory (ROM) bit cell array;
an error correction code (ECC) serialized word embedded in the ROM bit cell array;
a repair circuit coupled to a programmable array and one or more outputs of the ROM bit cell array;
a ROM built-in-self-test (RBIST) multiple input signature register (MISR) and a hamming code logic circuit coupled to an output of the repair circuit; wherein:
the ROM bit cell array is expanded to include ECC bits in the serialized word;
the hamming code logic circuit identifies a location of a bit failure; and
the repair circuit comprises one or more redundant repairs having a word address match logic block, a data I/O address, and at least one tri-state buffer;
the word address match logic block is provided to the at least one tri-state buffer as a control input;
the data I/O address is provided to the at least one tri-state buffer as an input;
an output of the at least one tri-state buffer of each redundant repair is provided as a first input to one or more logic devices; and
one or more data outputs of a ROM bit cell array is provided as a second input to a respective one of the one or more logic devices.

8. The structure of claim 7, wherein:
the data I/O address is provided as the input to a first tri-state buffer;
a data value is provided as an input to a second tri-state buffer;
the word address match logic block is provided to the first tri-state buffer and the second tri-state buffer as the control input;
an output of the first tri-state buffer is provided to the one or more logic devices as a select signal; and
an output of the second tri-state buffer is provided as the first input to one or more logic devices.

* * * * *